United States Patent [19]
Fong

[11] Patent Number: 5,268,597
[45] Date of Patent: Dec. 7, 1993

[54] OUTPUT BUFFER CIRCUIT WITH NOISE REDUCTION CIRCUIT

[75] Inventor: Vincent L. Fong, Fremont, Calif.

[73] Assignee: Hyundai Electronics America, San Jose, Calif.

[21] Appl. No.: 932,450

[22] Filed: Aug. 19, 1992

[51] Int. Cl.⁵ .................. H03K 17/16; H03K 19/092
[52] U.S. Cl. ................................ 307/443; 307/475; 307/482.1
[58] Field of Search ............ 307/475, 443, 451, 482.1

[56] References Cited

U.S. PATENT DOCUMENTS

| | | | |
|---|---|---|---|
| 4,587,445 | 5/1986 | Kanuma | 307/475 |
| 4,843,262 | 6/1989 | Abe | 307/475 |
| 4,975,598 | 12/1990 | Borkar | 307/443 |
| 5,095,231 | 3/1992 | Sartori et al. | 307/475 |
| 5,118,971 | 6/1992 | Schenck | 307/443 |

Primary Examiner—Edward P. Westin
Assistant Examiner—Richard Roseen
Attorney, Agent, or Firm—Townsend and Townsend Khourie and Crew

[57] ABSTRACT

An output buffer circuit, which reduces its switching speed in response to the operation of a neighboring output buffer circuit, is presented. The output buffer circuit has a pair of drive transistors which switch complementarily in responsive to an input signal to the buffer circuit. In normal operation, each of the drive transistors is driven by a speed-up block for high-speed switching. When a similar drive transistor of a neighboring output buffer circuit is also switching, the speed-up block is switched off so that the drive transistor of the first output buffer circuit switches in a slower mode to avoid noise generation. The noise reduction connection between output buffer circuits is in the form of a daisy chain.

8 Claims, 3 Drawing Sheets

OUTPUT BUFFER CIRCUIT WITH NOISE REDUCTION CIRCUIT

BACKGROUND OF THE INVENTION

The present invention is related to integrated circuit output buffers and, more particularly, to output buffer circuits for reducing noise.

An output buffer is a common circuit found in integrated circuits. These circuits are used to drive signals from the integrated circuit to the external environment. Typically in a MOS integrated circuit, the output buffer circuit is formed by a pair of large drive transistors serially connected between the first power supply, at $V_{CC}$, which is higher than the second power supply, typically at ground. The common source/drain connection between the two drive transistors forms the output terminal of the buffer circuit. The gates of the two drive transistors are typically connected to some logic so that signals are generated on the gates of the drive transistors in response to a logic signal at an input terminal of the buffer circuit. In this manner, one, or the other, of the drive transistors is turned on and the other off so that a logic high or logic low signal is created at the output terminal. Sometimes the logic circuit has a control terminal to turn the buffer circuit off and on. Such a typical output buffer circuit is shown in FIG. 1.

However, buffer circuits typically have a problem with noise generated by the switching of the drive transistors. This noise is generated on the power supply buses when the drive transistors turn off and on. Typically an integrated circuit has several buffer circuits connected parallel at the periphery of an integrated circuit die. Typically, the noise is defined by $\Delta V = L(dI/dt)$ where L is a total inductance of the respective power buses on the integrated circuit and (dI/dt) is the instantaneous change in current through the power bus.

These generated noises can often be very large to create various problems, including the misinterpretation of the logic state of a digital signal. The present invention is an output buffer circuit which lowers the generation of noise in a circuit arrangement which does not occupy very much valuable integrated circuit space.

SUMMARY OF THE INVENTION

The present invention provides an output buffer circuit for an integrated circuit device having a plurality of output buffer circuits connected between a first and second voltage supply. Each of the buffer circuits with an input terminal and an output terminal, has first and second MOS transistors. The first source/drain of the first MOS transistor connected to the first voltage supply and a second source/drain of the first MOS transistor is connected to the output terminal and to a first source/drain of the second MOS transistor. The second source/drain of the second MOS transistor is connected to the second voltage supply.

Logic is connected to the input terminal and to gates of the first and second MOS transistors for alternatively driving the gate terminal of the first MOS transistor or the second MOS transistor responsive to a signal on the input terminal to generate a signal on the output terminal. The output buffer circuit has a speed-up block for enhancing the rate of drive from the logic means to the gates of the first and second MOS transistors. The speed-up block is disabled responsive to the operation of a second output buffer circuit whereby cumulative noise by simultaneous operation of a plurality of said buffer circuits is reduced.

DESCRIPTION OF THE PREFERRED EMBODIMENT

As explained above, an output buffer circuit has typically two large drive transistors. One drive transistor is connected to the more positive power supply, at $V_{CC}$, for example, and is often termed as "pulling up" the output terminal of the buffer circuit when the drive transistor is engaged. Likewise, the second drive transistor is connected to more negative power supply, at ground, for example, and is often termed as "pulling down" the output terminal when the second drive transistor is activated.

Hence the noise generated on the $V_{CC}$ power supply bus may viewed as follows:

$$\Delta V_{CC} = L_{VCC} * (\Delta I_{PU}/\Delta t)$$

Likewise, the noise on the ground bus is:

$$\Delta V_{GND} = L_{GND} * (\Delta I_{PD}/\Delta t)$$

The terms, $\Delta I_{PU}$ and $\Delta I_{PD}$, represent the instantaneous change in current through the respective power supply buses. The inductances, $L_{VCC}$ and $L_{GND}$, are physical parameters for the two power supply buses and are basically unchangeable in the integrated circuit. Hence noise reduction has typically relied heavily on lowering the value of the parameter $(\Delta I/\Delta t)$. Since the output buffer circuit must satisfy specified load driving capabilities, the sizes of the two drive transistors are constrained. In other words, these drive transistors cannot be downsized to lower $\Delta I/\Delta t$. Therefore, many previous efforts to reduce the term $(\Delta I/\Delta T)$, has been to regulate the gate voltage, about the only parameter which can be adjusted. Such efforts have included the addition of a reference circuit for voltage regulation of the gates of these drive transistors. The technique has worked well when only one output buffer circuit which switches at a time. However, in a typical integrated circuit, several output buffer circuits switch at once. The noise on the power supply buses is accumulated from these output buffer circuits. Hence this technique is not very effective.

Figure 1:
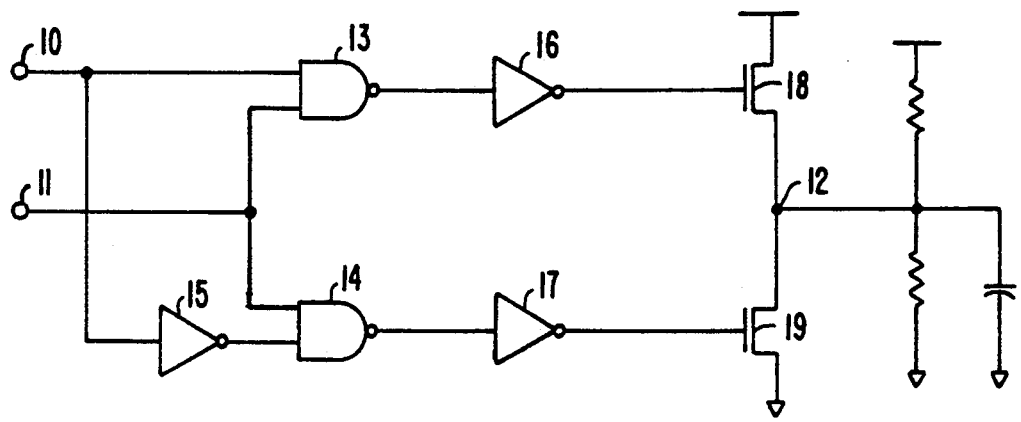
FIG. 1 is a typical output buffer circuit found in the prior art.
Figure 2:
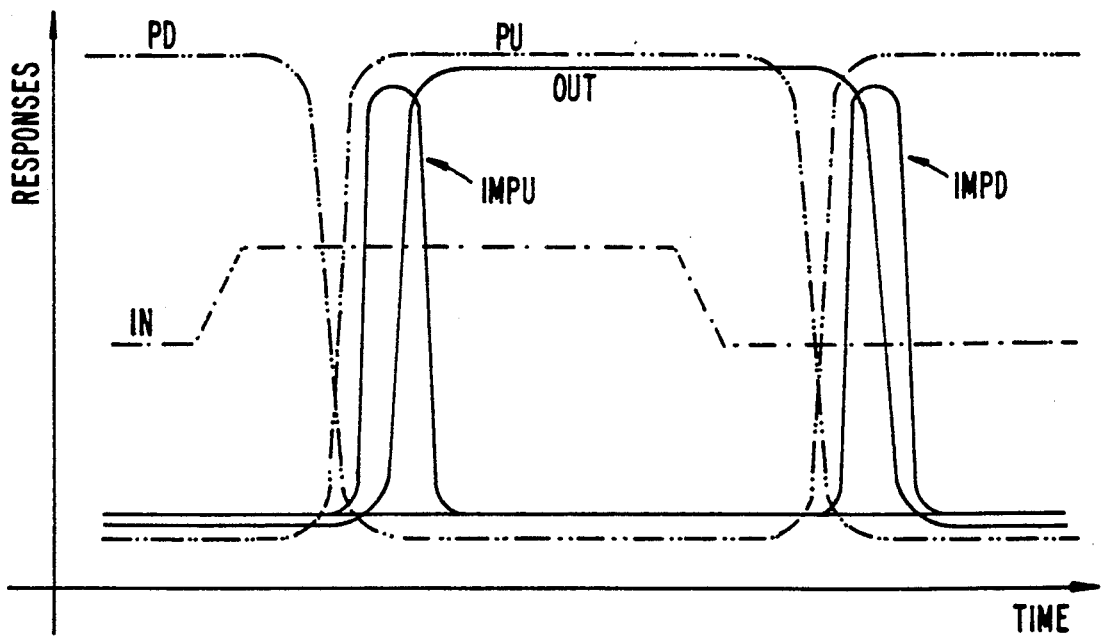
FIG. 2 shows the switching signals in terms of both current and voltage through an output buffer circuit.
Figure 3:
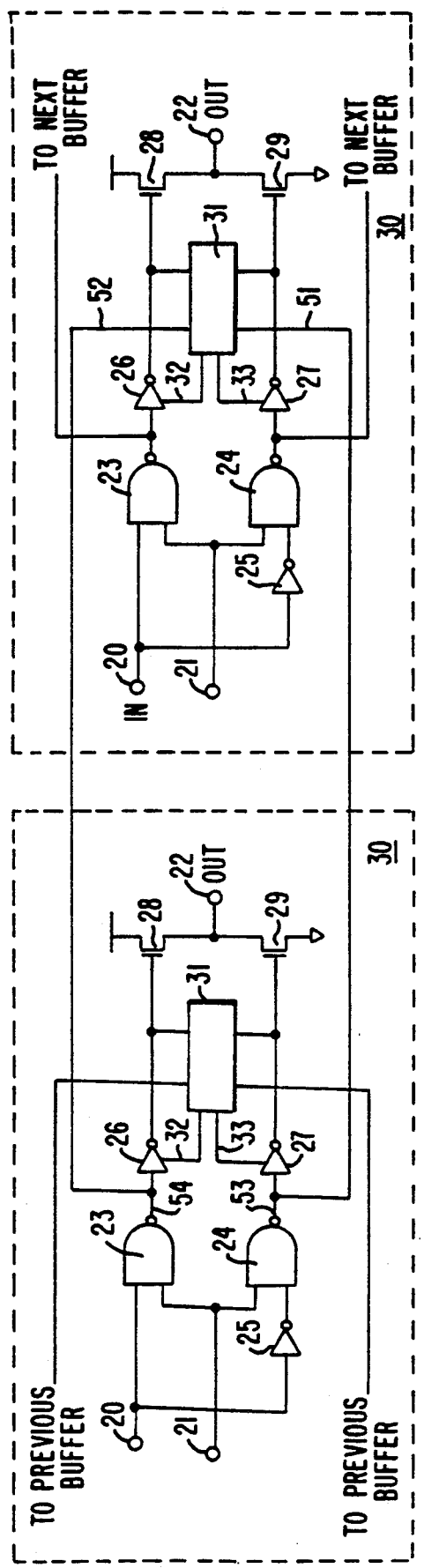
FIG. 3 illustrates an output buffer circuit according to one embodiment of the present invention.

In contrast, according to the present invention the gate voltages of the drive transistors of output buffer circuits are controlled according to whether neighboring output buffer circuits are switching or not. FIG. 3 illustrates output buffer circuits 30 according to one embodiment of the present invention. Each output buffer circuit has a pull-up drive transistor 28 and a pull-down drive transistor 29, which are serially connected between $V_{CC}$ and ground. The common connection between the source and drain of the NMOS transistors 28 and 29 respectively are connected to the output terminal 22 of the output buffer circuit. The gates of the drive transistors 28 and 29 are controlled in a complementary fashion in response to an input logic signal on the input terminal 20. The terminal 20 is connected to an input node of a NAND gate 23 which has its output node 54 connected to the gate of the drive transistor 28 through an inverter 26. The input terminal 20 is also connected to an input node of a NAND gate 24 through an inverter 25. An output node 53 of the NAND gate 24 is connected to the gate of the drive transistor 29 through an inverter 27. Second input nodes of the NAND gates 23 and 24 respectively are connected to a control terminal 21 which receives an ENABLE signal.

As shown in FIG. 3, each of the output buffer circuits 30 are also connected to other output buffer circuits by a speed enhancement block 31. Each block 31 is connected to a neighboring output buffer circuit 30 by lines 51 and 52. Furthermore, the output nodes 54 and 53, respectively, of the NAND gates 23 and 24 are connected to a speed enhancement block 31 of another neighboring output buffer circuit. Generally stated, if a corresponding drive transistor in a first output buffer circuit is not being switched, then the speed enhancement block 31 in a second, connected, output buffer circuit is enabled to enable a high-speed change in the voltage of the drive transistor in the second output buffer circuit.

Figure 4:
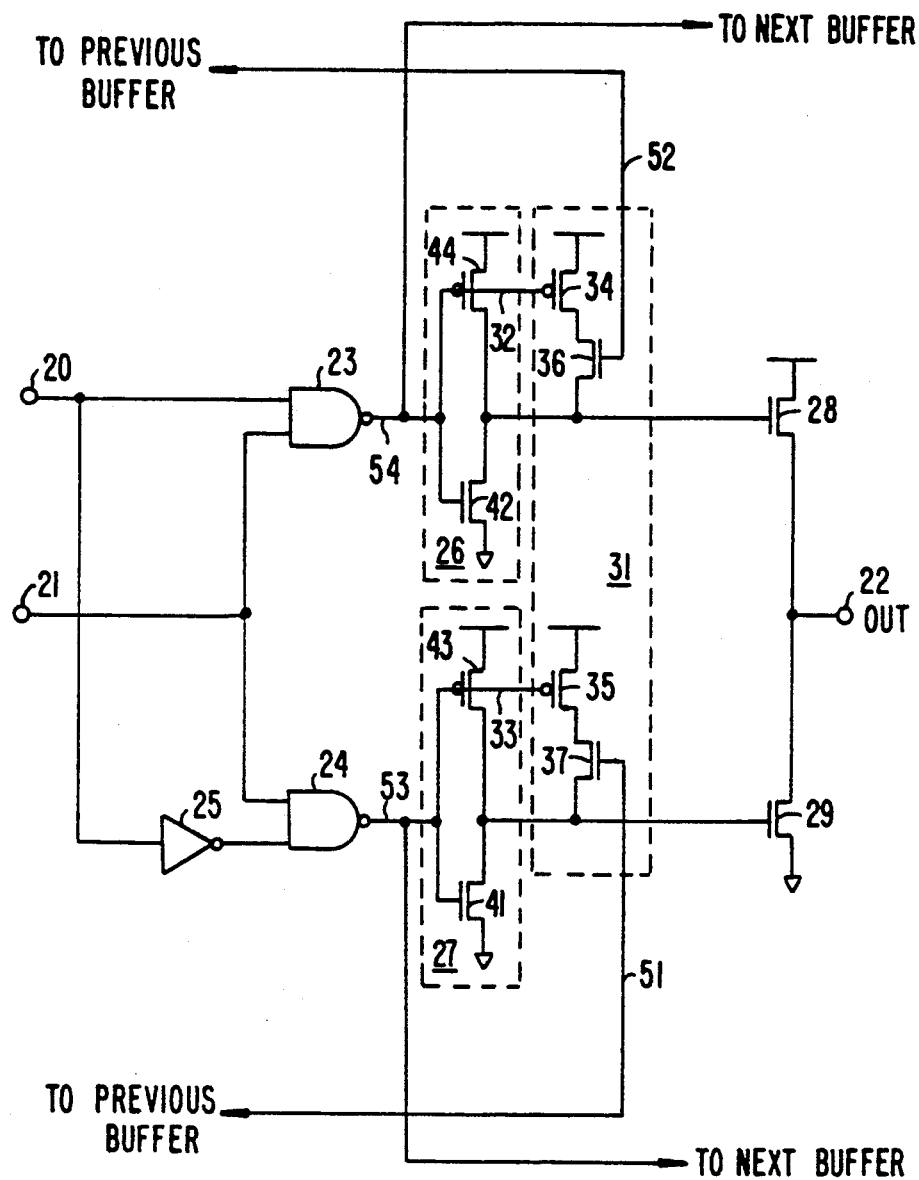
FIG. 4 is a more detailed circuit diagram of the output buffer circuit shown in FIG. 3.

The circuit schematic of the speed enhancement block 31 in each output buffer circuit 30 is shown in FIG. 4. Connected to the inverters 26 and 27, which have conventional inverting circuits, are transistors 34 and 36, and 35 and 37, respectively. The PMOS transistor 34 has a source connected to the $V_{CC}$ power supply and a drain connected to the drain of the NMOS transistor 36. The transistor 36 has its source connected to the output node, the common connection between the transistors 42 and 44, of the inverter 26. The gate of the PMOS transistor 34 is connected to the gate of the PMOS transistor 44 of the inverter 26. The gate of the NMOS transistor 36 is connected to the line 52 which is connected to the output node 54 of the NAND gate 23 of a previous output buffer circuit.

Likewise, the PMOS transistor 35 of the speed-up block 31 has its source connected to the $V_{CC}$ supply bus and its drain connected to the drain of the NMOS transistor 37. The NMOS transistor 37 has its source connected to the output node, the common connection between the transistors 41 and 42, of the inverter 27. The gate of the PMOS transistor 35 is connected to the gate of the PMOS transistor 43 of the inverter 27. The gate of the NMOS transistor 37 is connected by the line 51 which is connected to the output node 53 of the NAND gate 23 of the previous output buffer circuit.

The transistors of the inverters 26 and 27 are sized such that they provide a minimum voltage bias on the gates of the drive transistors 28 and 29 respectively. In other words, the transistors of the inverters 26 and 27 provide just enough current to the gates of the drive transistors 28 and 29 so that the drive transistors switch slowly to avoid creating too much noise. Of course, performance is not optimal for the output buffer circuit.

When the previous output buffer circuit is not driving the corresponding pull-up drive transistor 28 on, a logic one signal is received on the line 52 to turn on the transistor 36 in the output buffer circuit under examination. The block 31 is enabled for the drive transistor 28. An input signal on the terminal 20 which makes the output signal on the NAND gate 23 low turns on the PMOS transistor 44 on and the NMOS transistor 42 off, the transistors of the inverter 26. The gate of the drive transistor 28 is charged to turn on the transistor 28. The PMOS transistor 34 of the block 31 is also turned on. The two transistors 34 and 36 are sized large enough to pass a large current to increase the charging of the gate of the pull-up transistor 28 and the transistor 28 is switched on rapidly. $\Delta I_{PU}/\Delta t$ is large. Thus while switching speed is enhanced, noise is generated. However, since the previous output buffer circuit did not turn on its pull-up drive transistor 28. Furthermore, the signal on the output node 54 to the next output buffer circuit on the line 52 ensures that the pull up drive transistor 28 of the next output buffer circuit is not turned on rapidly either. Noise generation is minimized.

Similarly, the transistors 35 and 36 of the block 31 are sized and operate in the same fashion.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. In an integrated circuit device having a plurality of output buffer circuits connected between a first and second voltage supply, each of said buffer circuits having an input terminal and an output terminal, said buffer circuit comprising first and second MOS transistors, each transistor having first and second source/drains and a gate, a first source/drain of said first MOS transistor connected to said first voltage supply, a second source/drain of said first MOS transistor connected to said output terminal and to a first source/drain of said second MOS transistor, a second source/drain of said second MOS transistor connected to said second voltage supply;

logic means connected to said input terminal and to gates of said first and second MOS transistor for alternatively driving said gate terminal of said first MOS transistor or said second MOS transistor responsive to a logic level of a signal on said input terminal to generate a signal on said output terminal; and means for enhancing the rate of drive from said logic means to said gate terminals, said enhancing means being disabled responsive to the operation of a neighboring output buffer circuit;

whereby cumulative noise by simultaneous operation of a plurality of said buffer circuits is reduced.

2. The buffer circuit as in claim 1 wherein said enhancing means increases current drive from said logic means to said gate terminals of said first and second MOS transistors.

3. The buffer circuit as in claim 2 wherein said enhancing means increases current to one of said gate terminals of said first and second MOS transistors when said logic means charges said one gate terminal.

4. The buffer circuit as in claim 2 wherein said logic means has logic gates having first and second output nodes, said logic gates first output node connected to an input node of a first inverter, said first inverter having an output node connected to said gate of said first MOS transistor, said logic gates second output node connected to an input node of a second inverter, said second inverter having an output node connected to said gate of said second MOS transistor, and wherein said enhancing means is connected to said output nodes of said first and second inverters.

5. The buffer circuit as in claim 4 wherein each one of said first and second inverters comprises third and fourth MOS transistors, each transistor having first and second source/drains and a gate, a first source/drain of said third MOS transistor connected to said first voltage supply, a second source/drain of said third MOS transistor connected to said inverter output node and to a first source/drain of said fourth MOS transistor, a second source/drain of said fourth MOS transistor connected to said second voltage supply, said gate terminals of said third and fourth MOS transistors connected to said inverter input node; and wherein said enhancing means comprises fifth and sixth MOS transistors associated with each one of said first and second inverters, each transistor having first and second source/drains and a gate, a first source/drain of said fifth MOS transistor connected to said first voltage supply, a second source/drain of said fifth MOS transistor connected to a first source/drain of said sixth MOS transistor, a second source/drain of said sixth MOS transistor connected to said respective inverter output node, a gate terminal of said fifth MOS transistor connected to input node of said associated inverter, and said gate terminal of said sixth MOS transistor connected to said neighboring output buffer circuit.

6. The buffer circuit as in claim 5 wherein said gate terminal of said sixth MOS transistor associated with each one of said first and second inverters is connected respectively to said input node of each one of said first and second inverters of said neighboring output buffer circuit.

7. The buffer circuit as in claim 5 wherein said first and second MOS transistors comprise N-channel transistors.

8. The buffer circuit as in claim 7 wherein said third and fifth MOS transistors comprise P-channel transistors, and fourth and sixth MOS transistors comprise N-channel transistors.

* * * * *